United States Patent
Bhattacharyya et al.

(10) Patent No.: US 9,494,872 B2
(45) Date of Patent: Nov. 15, 2016

(54) INSPECTION METHOD FOR LITHOGRAPHY

(75) Inventors: Kaustuve Bhattacharyya, Veldhoven (NL);
(Continued)

(73) Assignee: ASML Netherlands B.V., Veldhoven (NL)

( * ) Notice: Subject to any disclaimer, the term of this patent is extended or adjusted under 35 U.S.C. 154(b) by 616 days.

(21) Appl. No.: 13/060,390

(22) PCT Filed: Sep. 8, 2009

(86) PCT No.: PCT/EP2009/006518
§ 371 (c)(1),
(2), (4) Date: May 12, 2011

(87) PCT Pub. No.: WO2010/031510
PCT Pub. Date: Mar. 25, 2010

(65) Prior Publication Data
US 2011/0229830 A1   Sep. 22, 2011

Related U.S. Application Data

(60) Provisional application No. 61/097,374, filed on Sep. 16, 2008.

(51) Int. Cl.
*G03F 7/20* (2006.01)
(52) U.S. Cl.
CPC ....... *G03F 7/70633* (2013.01); *G03F 7/70625* (2013.01)
(58) Field of Classification Search
CPC .................. G03F 7/70633; G03F 7/70625
See application file for complete search history.

(56) References Cited

U.S. PATENT DOCUMENTS

| | | | |
|---|---|---|---|
| 8,072,611 B2 * | 12/2011 | De Groot | 356/511 |
| 2004/0004726 A1 | 1/2004 | Sezginer et al. | |
| 2009/0147247 A1 * | 6/2009 | Endo et al. | 356/237.2 |

OTHER PUBLICATIONS

International Search Report directed to related International Application No. PCT/EP2009/006518, the International Searching Authority, Rijswijk, Netherlands, mailed Dec. 28, 2009; 3 pages.

(Continued)

*Primary Examiner* — Kara E Geisel
*Assistant Examiner* — Rebecca C Bryant
(74) *Attorney, Agent, or Firm* — Sterne, Kessler, Goldstein & Fox P.L.L.C.

(57) ABSTRACT

The present invention relates to an inspection apparatus and method which include projecting a measurement radiation beam onto a target on a substrate in order to measure the radiation reflected from the target and obtain information related to properties of the substrate. In the present embodiments, the measurement spot, which is the focused beam on the substrate, is larger than the target. Information regarding the radiation reflected from the target is kept and information regarding the radiation reflected from the surface around the target is eliminated. This is done either by having no reflecting (or no specularly reflecting) surfaces around the target or by having known structures around the target, the information from which may be recognized and removed from the total reflected beam. The reflected beam is measured in the pupil plane of the projector such that the information obtained is related to diffraction orders of the reflected beam and profile, critical dimension or overlay of structures on the substrate may be determined.

32 Claims, 11 Drawing Sheets

(75) Inventors: Arie Jeffrey Den Boef, Waalre (NL);
Marcus Adrianus Van De Kerkhof, Helmond (NL); Maurits Van Der Schaar, Eindhoven (NL)

(56) References Cited

OTHER PUBLICATIONS

International Preliminary Report on Patentability and Written Opinon directed to related International Application No. PCT/EP2009/006518, The International Bureau of WIPO, Geneva, Switzerland, issued Mar. 22, 2011; 7 pages.

* cited by examiner

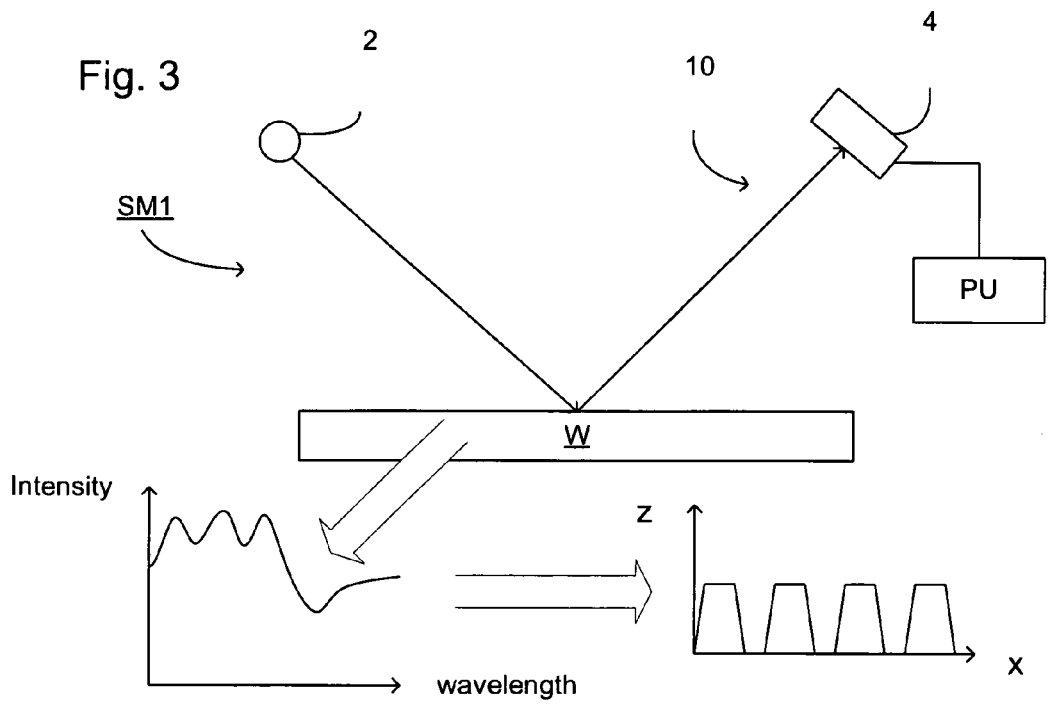
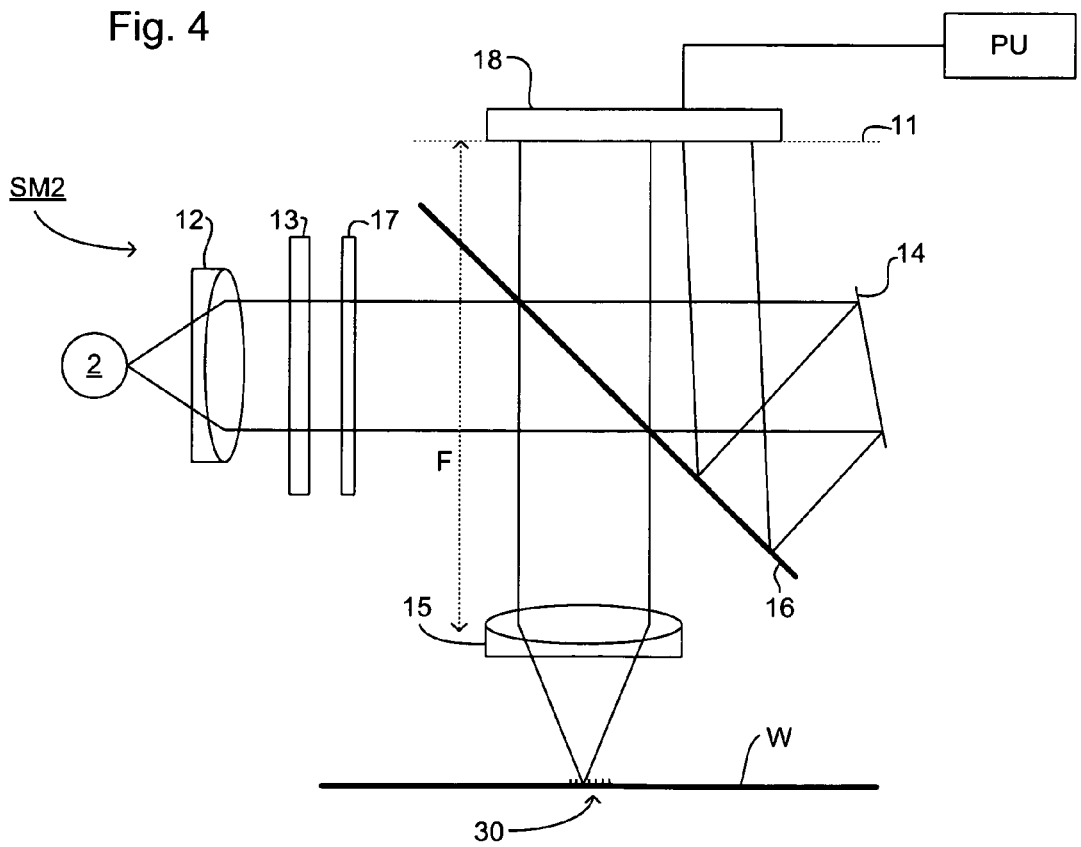

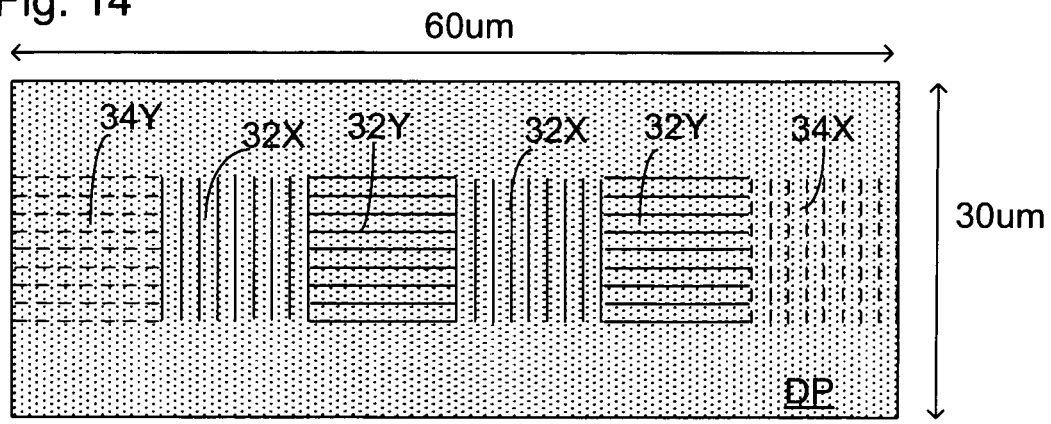
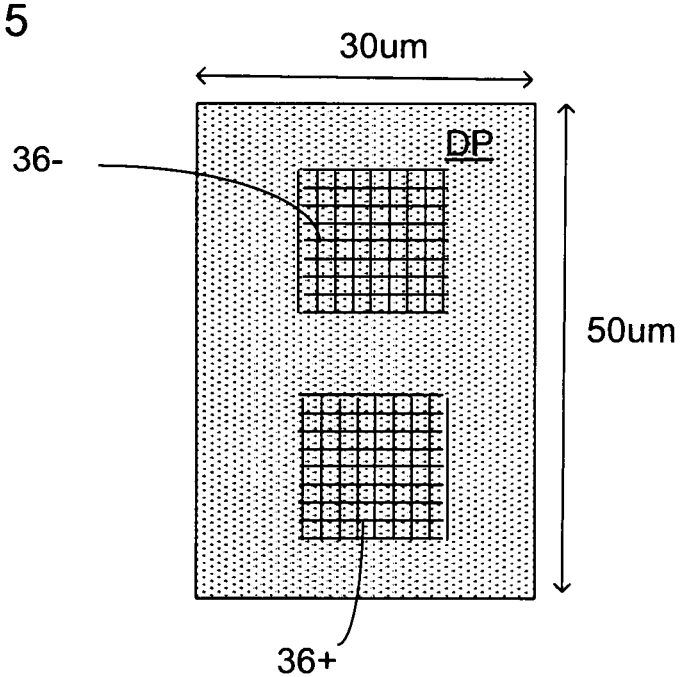

Fig. 17
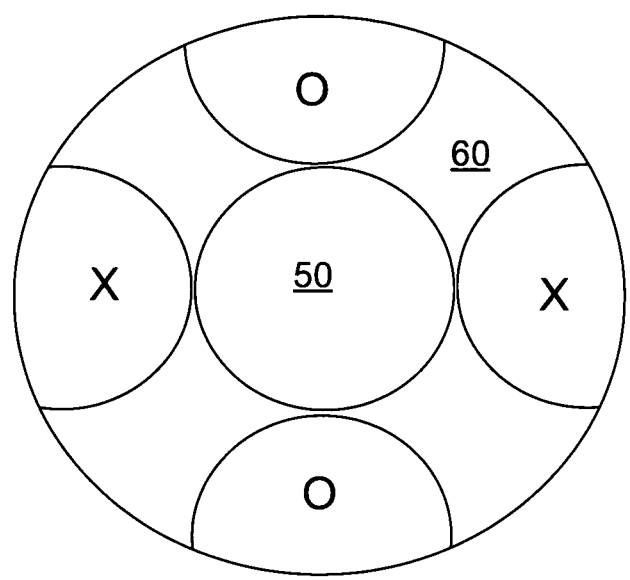
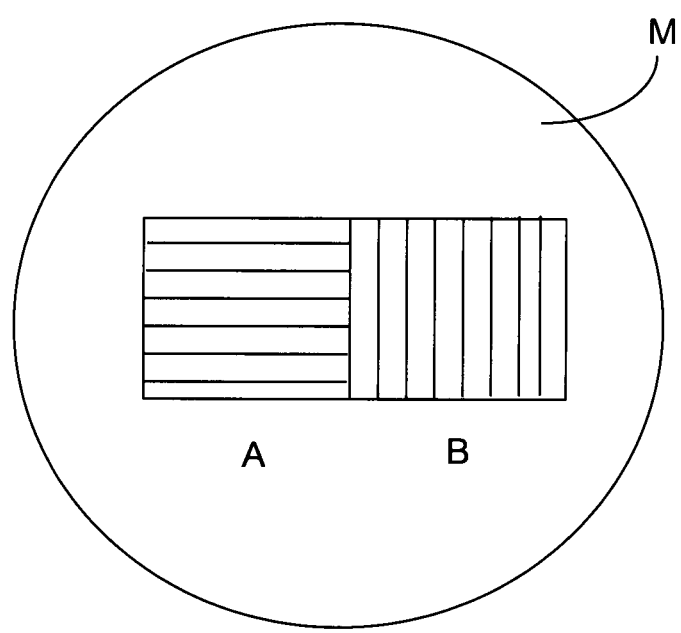

INSPECTION METHOD FOR LITHOGRAPHY

CROSS-REFERENCE TO RELATED APPLICATIONS

This application claims the benefit of U.S. provisional application 61/097,374, which was filed on Sep. 16, 2008, and which is incorporated herein in its entirety by reference.

FIELD

The present invention relates to methods of inspection usable, for example, in the manufacture of devices by lithographic techniques and to methods of manufacturing devices using lithographic techniques. Specifically, the present invention relates to methods of determining overlay, critical dimension and other properties of structures within a target on the substrate.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection apparatus is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle. Ellipsometers measure relative intensities of (portions of) radiation beams with different polarizations.

In scatterometers and lithographic apparatus, targets are used in the determination of overlay errors. These targets are conventionally positioned in the scribe lanes between the patterns. The overlay error at the target site is thus measured. However, the overlay error at the position of the pattern is therefore an interpolation from the measured overlay at different points surrounding the pattern, and not a measurement of the overlay on the pattern itself.

Although the targets could be positioned within the patterns themselves, this has the disadvantage that the targets used are relatively large and therefore take up too much of the are designed for product patterns, thereby compromising device functionality and taking up valuable "real estate".

Similarly, targets are used in the determination of the profile of pattern structures. The accuracy of lithographic apparatuses is measured by measuring the size, shape (i.e. the profile), and dimensions (e.g. critical dimension (CD), side wall angle and other more complex dimensions from two-dimensional patterns) of structures within the target, properties of layers on the substrate such as layer thicknesses and material properties (n, k) of subsurface layers, and even geometrical properties from structures below a top level structure in the substrate, and this is extrapolated to the structures (and layers) of the pattern. As the behavior of the exposure portion of the lithographic apparatus can change over the surface of a substrate, this extrapolation is not always as accurate as would be desired.

SUMMARY

It is desirable to provide a method of measuring a target which is sufficiently small to be placed on the substrate within the pattern while interfering with the pattern (and the measurement of the pattern) as little as possible.

According to an aspect of the invention, there is provided an inspection apparatus, lithographic apparatus or lithographic cell configured to derive a property of a substrate by measuring a target on the substrate, comprising:
  a radiation source configured to emit a radiation beam;
  an optical system configured to focus the radiation beam onto the substrate; and
  a detector configured to detect the radiation beam reflected from the substrate, wherein
  the optical system is configured to focus the radiation beam into a measurement spot that is larger in at least one dimension than the target to be measured; and
  the detector is configured to detect the reflected radiation beam in or in the vicinity of a pupil plane of the optical system.

According to another aspect of the invention, there is provided an inspection apparatus configured to measure a target on a substrate, the apparatus comprising:
  a radiation projector configured to project radiation onto said substrate;
  a high numerical aperture lens.
  a detector configured to detect the radiation beam reflected from a surface of the substrate to form Fourier transform data; and
  a data processor, said data processor configured to:
  remove the portions of said Fourier transform data which correspond to said target to form reduced Fourier transform data;

interpolate the portions of said reduced Fourier transform data which were removed, to form product Fourier transform data; and subtract said product Fourier transform data from said Fourier transform data to form target data.

According to another aspect of the invention, there is provided a method of measuring a property of a target on a substrate, comprising:

emitting a radiation beam;

focusing the radiation beam onto the substrate using an optical system; and detecting the radiation beam reflected from the substrate, wherein the radiation beam is focused into a measurement spot that is larger in at least one dimension than the target to be measured; and the reflected radiation beam is detected in or in the vicinity of a pupil plane of the optical system.

A further method is provided of measuring a target on a substrate, the method comprising:

projecting radiation onto a substrate;

detecting said radiation reflected by said substrate to form a set of Fourier transform data;

removing the portions of said Fourier transform data which correspond to said target to form reduced Fourier transform data;

interpolating the portions of said reduced Fourier transform data which were removed, to form product Fourier transform data; and subtracting said product Fourier transform data from said Fourier transform data to form target data.

Finally, according to a yet further aspect of the invention, there is provided a substrate comprising a target for use with an inspection apparatus to measure a property of the substrate, wherein the target comprises a useful signal-generating portion of a pattern on the substrate, and is surrounded by non-useful signal-generating portions of the pattern, the useful signal giving rise to a measurement of a property of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 depicts a first scatterometer;
FIG. 4 depicts a second scatterometer;
FIGS. 13 and 14 depict targets surrounded with dummy targets and dummy patterns;
FIG. 15 depicts a two-dimensional target surrounded by a dummy pattern;
FIG. 17 depicts a first example of mathematical removal of information from the area surrounding the substrate.

DETAILED DESCRIPTION

Figure 1:
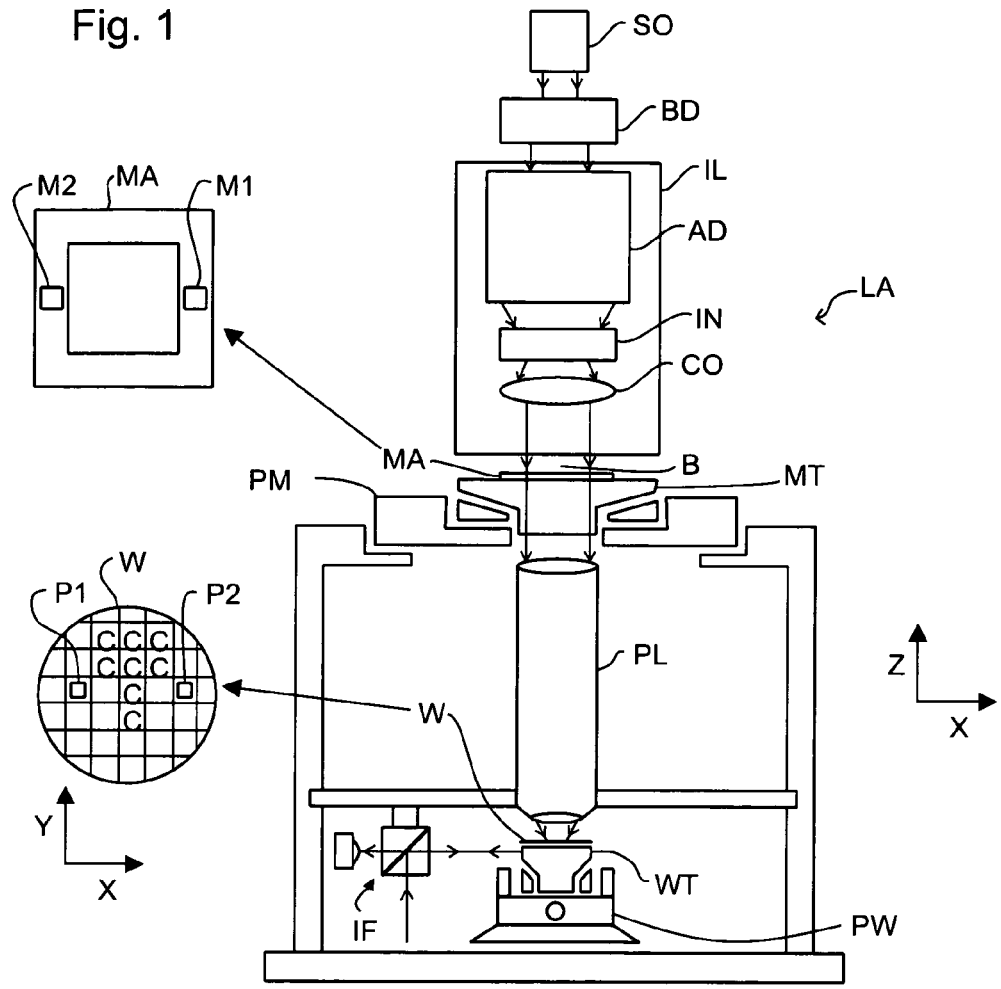
FIG. 1 depicts a lithographic apparatus.

FIG. 1 schematically depicts a lithographic apparatus. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
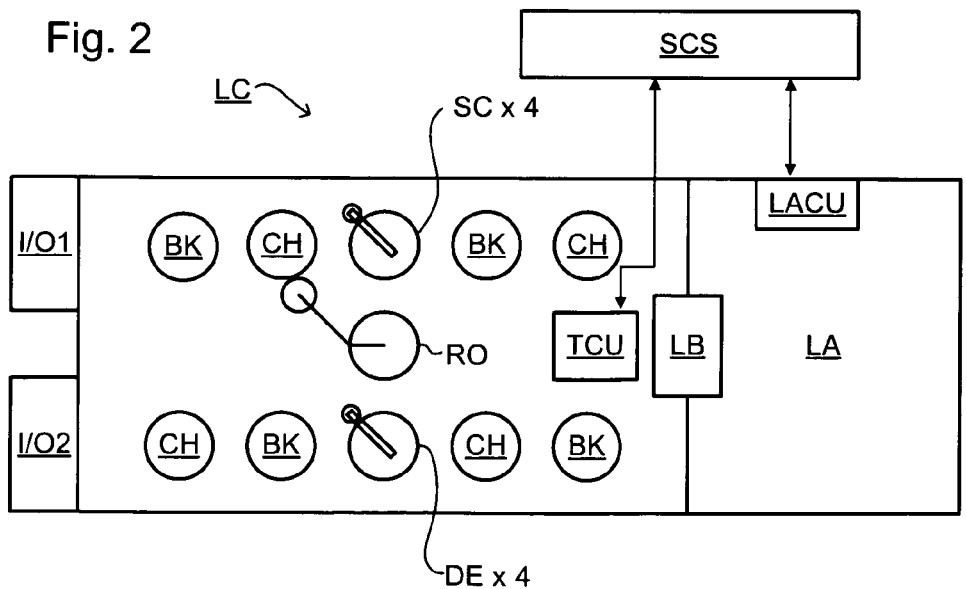
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

FIG. 3 depicts a scatterometer which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer that may be used with the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of *8 and a spacing of at least 2*8 (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

The present invention allows smaller targets to be more accurately measured. Thus targets used in conjunction with the invention may be less than 15 μm×15 μm, preferably less than 10 μm×10 μm, and even as small as 5 μm×5 μm. This is in comparison to other systems, where 40 μm×40 μm targets are more common. The advantage of being able to have smaller targets is that they may be used in-die. The advantage of this, as discussed above, is that a measurement that is more relevant to the product may be obtained. Another advantage of smaller targets is that less scribe lane space may be used in the case when said targets are placed in the scribe lanes. Clearly, if the targets are in-die, no scribe lane space is used anyway. Scribe lane space is valuable real estate for other forms of markers and it is desirable to leave as much of the scribe lane space available as possible. Furthermore, also as mentioned above, having inspection targets in-die (i.e. in the product pattern of the substrate) means that more accurate measurements of the properties of the product pattern itself may be made because the extrapolation from inspection target to product pattern does not have to be as large. The measurable characteristics of the targets of the present invention may be one-dimensional (e.g. X-axis only); two-dimensional (X- and Y-axes) or even three-dimensional (with the superposition of targets in subsequent layers or stacks on the substrate).

The main reason that targets have always had a minimum size is in fact related to the size of the measurement beam that is created by a radiation source and an optical focusing system (or projection system). It has proven to be extremely challenging to focus measurement beams or measurement spots to diameters of the order of 25 μm or below without major degradation of irradiance and of optical beam properties. Historically, the measurements spot would always have to be smaller than a target because it is important that only the information from the target is used when determining properties of that target (and thereby properties of the substrate such as overlay, CD measurements and other dimensions, profiles, etc.). Surrounding structures on a substrate will affect the scattered radiation from the target and cause huge amounts of noise in the detected radiation, leading to radiation measurements that have no meaning with respect to the target that was illuminated (i.e. irradiated).

The present invention has, as its general concept, the "overfilling" of targets. This means that a target is completely illuminated by a measurement spot such that the measurement spot does, in fact, overlap onto a surrounding area of the target. Further features of the present invention include ways of then removing or preventing information from radiation scattered from the substrate surface surrounding the target from being included in measurements of properties of the target.

Figure 5:
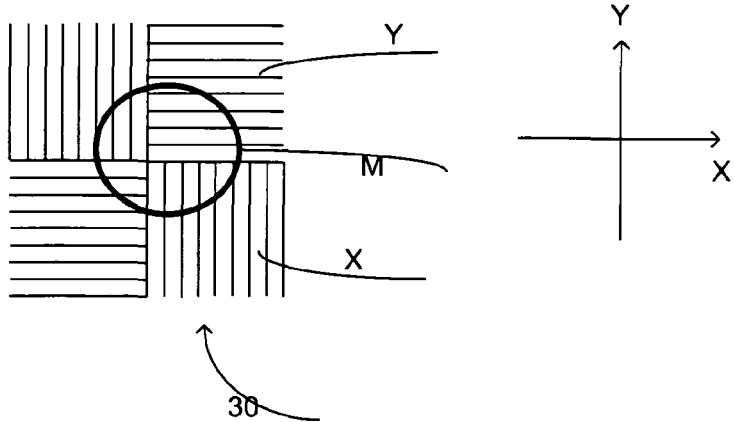
FIG. 5 depicts an underfilled target.

FIG. 5 shows an example of a target that is used to measure properties of a substrate that may vary in both the X and Y directions. Portions of the target 30 that are labeled Y have gratings in a first direction perpendicular to the Y-axis. If a second target is superimposed onto this first target 30, an offset between the superimposed target and the original target 30 will give rise to a measurement that is known as an error in overlay. If there is an error in the Y direction, the horizontal line Y will scatter an illumination beam in such a way as to demonstrate that the bars of the grating are not aligned. The same applies with respect to the X direction. Vertical bars in a grating are also superimposed and if there is an error in the overlay, light that is scattered from this part of the target will demonstrate if there is an error or an offset in the X direction. It is advantageous to use more than one grating for each direction in case the superimposed target is in fact rotated with respect to the original target 30. If there is a rotation error, the overlay error will be different in the two different gratings that are aligned in the same direction.

FIG. 5 also shows a measurement spot M. In the case shown in FIG. 5, the target is "underfilled", which means that the measurement spot M is smaller than the target. As the measurement spot M has a minimum diameter dependent on the projection system used to create the measurement spot, until now, the target 30 has also had a minimum size. The fundamental issue in reducing target size is that measurement performance decreases significantly when the edges of the measurement spot M and the target 30 more or less coincide. The edges of the measurement spot coinciding gives rise to diffraction effects at the geometric edge of the measurement spot. These "edge effect" become more problematic out of nominal focus. This is based on the assumption that the measurement spot will be more focused in its center than at its edges. The slightly less focused illumination edges, where they interact with the target, give rise to unwanted noise in the reflected (and hence scattered/diffracted) light.

Figure 6:
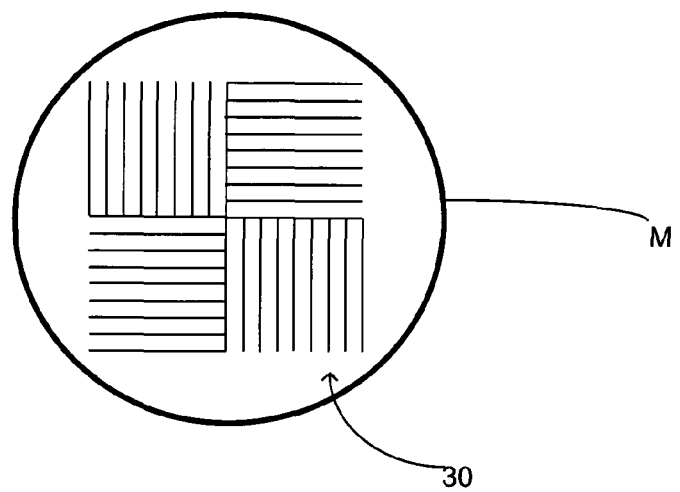
FIGS. 6 and 7 depict overfilled targets.
Figure 7:
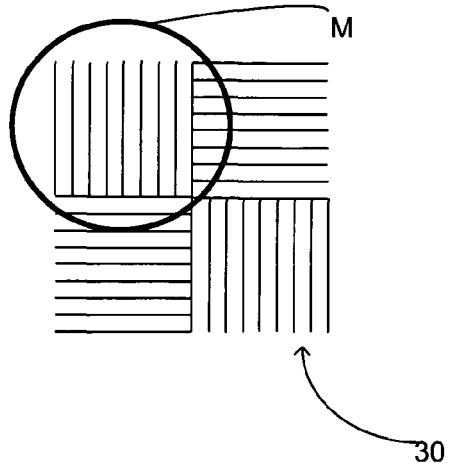

The central concept of the present invention is shown in FIGS. 6 and 7. To avoid the problem of coinciding edges of measurement spot M and target 30, the target dimension may be sufficiently smaller than the measurement spot M size so that the edges do not coincide. By "sufficiently smaller", it is understood that the variation in focus of the measurement spot will be a large contributing factor to how much within the measurement spot the target needs to be in order to reduce the edge effects. FIG. 6 shows a measurement spot that overfills the complete target 30 that measures overlay or other parameters in both the X and Y directions. FIG. 7, on the other hand, shows a measurement spot M that overfills a sub-target 32. The sub-target, if measured alone, will give rise to a single-parameter related signal. In other words, a sub-target is an example of a single useful signal-generating portion of the target. By "useful" signal, it is meant a signal that gives rise to a desired measurement. It is possible that illumination reflecting from an exclusion zone outside of the target also gives rise to some sort of signal, but if it is not related to the measurement of the property in question, it is not considered a "useful" signal.

In the case of FIG. 7, the parameter that might be being measured might be the critical dimension of a bar in the grating of the sub-target 32. When measuring the critical dimension of a single bar, the only signal that is required in the detected scattered radiation is that from the grating in question. In this case, the required target is only the sub-target 32. The surrounding area, including the other sub-targets, are non-useful signal-generating portions within the illumination spot because they do not relate to the measurement (or the parameter being measured) in question. Other dimensions of the structures within the pattern may also be measured such as side wall angle, which is the angle between the substrate surface and a surface of a structure rising up from it. Even more complex dimension measurements may be determined from two-dimensional targets on the substrate. Furthermore, properties of the layers on the substrate may be measured such as layer thickness and material properties of surface or subsurface layers, or even geometrical properties from structures below the top layer on the substrate. As long as radiation is diffracted differently by materials of different shape, density and orientation, all sorts of properties of the substrate and its structures may be determined from the diffracted radiation.

Even when measuring something like the critical dimension (CD), there are several ways in which a plurality of useful measurements made be made. The first way is using an angular-resolved scatterometer, which illuminates the grating 32 from several different angles and compares the resultant scattered light. Variations in the scattered light imply variations in the critical dimension of the bar of the grating. Alternatively, a spectroscopic scatterometer may be used, which illuminates the grating from a direction substantially along the normal to the grating, but the wavelength of the illumination beam varies. Again, the various ways in which the different wavelengths scatter is measured by a detector and the resultant critical dimension of the grating may be determined.

On the other hand, if it is overlay that is to be measured, it is useful to have this measured in both the X and Y directions in order to determine, for example, whether the substrate is repositioned in the same place between exposures of each layer. It is also therefore an object of the present invention to minimize the effective real estate that is used by targets which enables simultaneous measurements of overlay in both the X and Y directions, and it is therefore important to be able to use two-dimensional targets 30 as well as one-dimensional targets 32.

Figure 9:
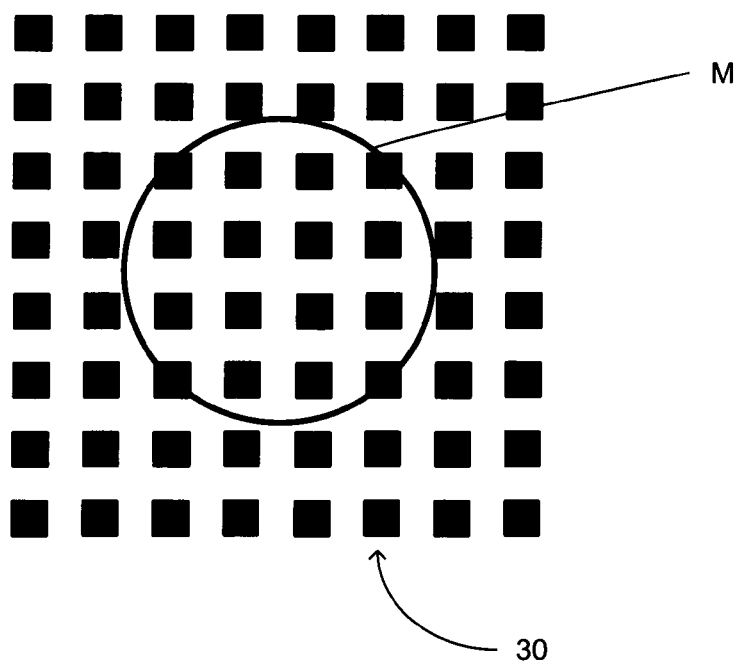
FIG. 9 depicts a two-dimensional target according to the state of the art.

Generic two-dimensional overlay targets such as shown in FIG. 9 suffer from cross-talk between the X and the Y directions in the pupil plane. This is caused by multiple coherent contributions with the same effective angle of diffraction at the substrate level. An improved target design such as shown in FIG. 7 spatially separates the X and Y portions of the grating structure. Both the X and Y direction information is present in the pupil plane (through the diffraction spectra), but without the cross-talk caused by a target such as that shown in FIG. 9. If the target from FIG. 9 is used to measure overlay, as mentioned above, a second target 30 is superimposed onto the first target 30 and the diffraction spectra of radiation beams scattered from the surface of the target gives rise to residual offsets or asymmetries that indicate that a misalignment in the two targets has occurred and that there is therefore an overlay error.

However, the target of FIG. 7 shows increased sensitivity to the exact positioning of the measurement spot M compared to the generic two-dimensional periodic gratings of FIG. 9. The reason for this is that if a measurement spot is present on mostly a grating aligned in the Y direction but partly over a grating aligned in the X direction, the resultant diffraction spectra do not give an indication of how much of each grating is in fact within the measurement area. The measurement spot must therefore be carefully aligned so that the detector can correlate the diffraction spectra with the exact part of the target that is being measured.

Figure 8:
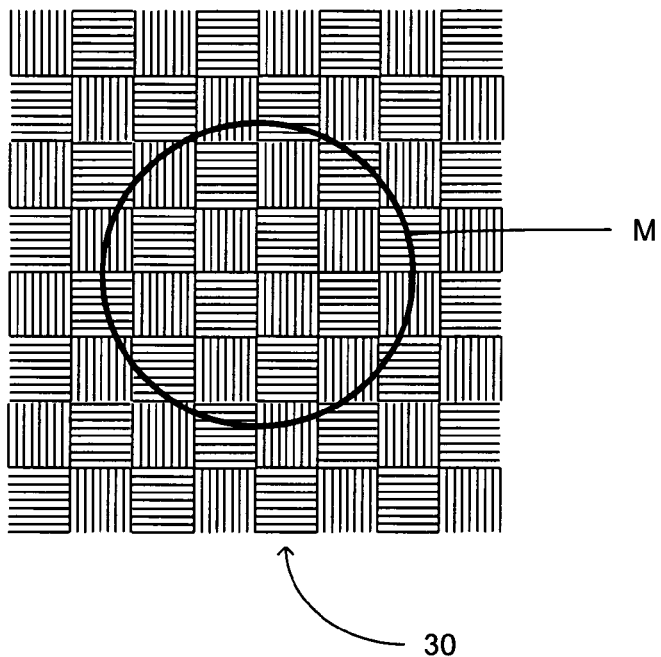
FIG. 8 depicts a two-dimensional target according to an embodiment of the invention.

In order to overcome the problems mentioned above, an embodiment of the present invention includes a multi-X Y target as shown in FIG. 8. The multi-X Y overlay target is built up from a large number of alternating X-Y-sub gratings (of FIG. 7). The optimum size and number of the sub gratings will depend on the exact special coherence of the measurement spot M. The same technique for measuring overlay as was used with the target of FIG. 9 may again be used, but the risk of cross-talk is diminished.

An advantage of this target 30 as shown in FIG. 8 is that the X and Y contributions will not be spatially separate, and therefore not need to be measured separately, but the large number of sub gratings will average out the spot displacement effect. Both the X and Y direction offsets may therefore be measured simultaneously. A further advantage of this target 30 is that the measurement spot may overfill each of the individual sub gratings 31 and therefore be any one of several different sizes (within a range) without the area surrounding each of the sub gratings 32 affecting the measurement unhelpfully. In other words, the surface of the substrate surrounding each of the sub gratings 32 is simply more of the same target 30 and may be included in the measurement spot without adding superfluous scattered radiation that would have to be removed subsequently from the resultant measurement.

As a further refinement to either the target 30 made up of sub gratings 32 as shown in FIG. 8, or the target 30 as shown in FIGS. 6 and 7 that have edges that do not coincide with the edges of the measurement spot, to minimize the degradation of the signal-to-noise ratio (SNR) related to the smaller dimensions of the target, the target dimensions can be chosen such that an optimum balance is achieved between SNR and edge overlap effects. This optimum balance is specific to the inspection apparatus that is used because it is dependent on relative placement and focus performance of the inspection apparatus.

When the radiation is focused on the target, there will additionally be diffraction from the surrounding pattern. The present invention works by either eliminating the diffraction information from the surrounding pattern first place or filtering out the diffraction from the surrounding pattern (in the pupil plane) such that only the portions from the target remain, as will be discussed below.

The relevance of the measurement in the pupil plane is that it is in the pupil plane that diffraction spectra of radiation that is scattered from the target may be measured. This is different from an image plane, where an image of the target will be reproduced. Of course, the measurement may be made near the pupil plane, or in its vicinity, as long as clear enough information is obtained to decipher the diffraction spectra as they would appear in the pupil plane. The information in the vicinity of the pupil plane will be similar to the information in the pupil plane, just slightly out of focus.

The diffraction spectra (or a diffraction information) gives more information on how the target effects the radiation beam that is reflected and (scattered/diffracted) from it. Usually, overlay measurements are based on first order or higher order diffraction angles. This is because when a radiation beam is used to illuminate a grating, more information on any asymmetry in the grating will be available by this radiation beam being scattered from it than would be available from a beam that simply illuminates the target from a direction normal to the target and thereby gives rise only to, for example, a zeroth diffraction order. However, either zeroth, first or a higher diffraction orders may also be detected and used to inspect other parameters of the target (and thereby of the substrate). As mentioned above, for example, spectroscopic scatterometry uses various wavelengths of radiation. Ellipsometry uses various polarization directions within the radiation beam and determines how the target affects light that is polarized in different directions.

As mentioned above, when a measurement spot is used that is larger than a target, diffraction information from the pattern surrounding the target should be prevented or measured and eliminated. One embodiment of this was described above with respect to FIG. 8, where the surrounding pattern is simply a repetition of the target pattern and adds to the useful measurement. There are other ways of designing the "exclusions zones" around the target in order to control or minimize the spurious signals caused by the diffracted light from the surrounding surface. For example, this exclusion zone can be tuned to optimize total target performance using one or several metrics such as:

1. Minimum specular reflection. In other words, the target can effectively be surrounded by a mirror-like surface. This would be particularly relevant to zeroth-order diffraction, which would result in a higher background signal for scatterometric or ellipsometric techniques. However, the background signal could be more easily determined and removed from the total signal.

2. Minimum processing sensitivity, for example, by appropriate shielding. One example of this is to use an aperture that allows only radiation from the target to be detected by a detector.

3. Minimum diffraction signal in a measured part of the Fourier space in case of diffraction-based techniques, or minimum signal in a resolution range of imaging-based techniques. Imaging based techniques, as mentioned above, are techniques that use selected information in an image plane, rather than in the pupil plane of the radiation projection system.

4. For an overlay technique, using (sub) targets in two separate stack layers to be compared, the exclusion zone design being different for the respective top and bottom (sub) targets. In this case, the diffraction information can be compared for the first and second stack layers, and the features that change can be assumed to be the exclusion zone which are different (and potentially known) for the top and bottom targets.

One further example of using an aperture is to place an aperture in an intermediate image plane of the optical projection system so that the measurement spot is reduced from its usual diameter of 25 μm to a diameter closer to the desired 5×5 μm of the target. The measurement spot at the intermediate image plane is a defocused image of the fiber end (i.e. the end of the fiber optic that transmits the radiation). A lens is normally placed at the intermediate image plane (where there is a 1:1 image of the fiber end beam). Instead of the lens, an aperture may be used to filter out outside defocused light and narrow the measurement beam. This smaller measurement spot means that a smaller exclusion zone is possible around the target. This aperture may be exchangeable, depending on the desired size and focus of the measurement spot. It is advantageous to reduce the exclusion zone as much as possible, whether it has no pattern, a dummy pattern or a device pattern, in order to remove non-useful signals that do not give rise to parameter measurements.

Alternatively, the surrounding information can be measured and removed.

Figure 10:
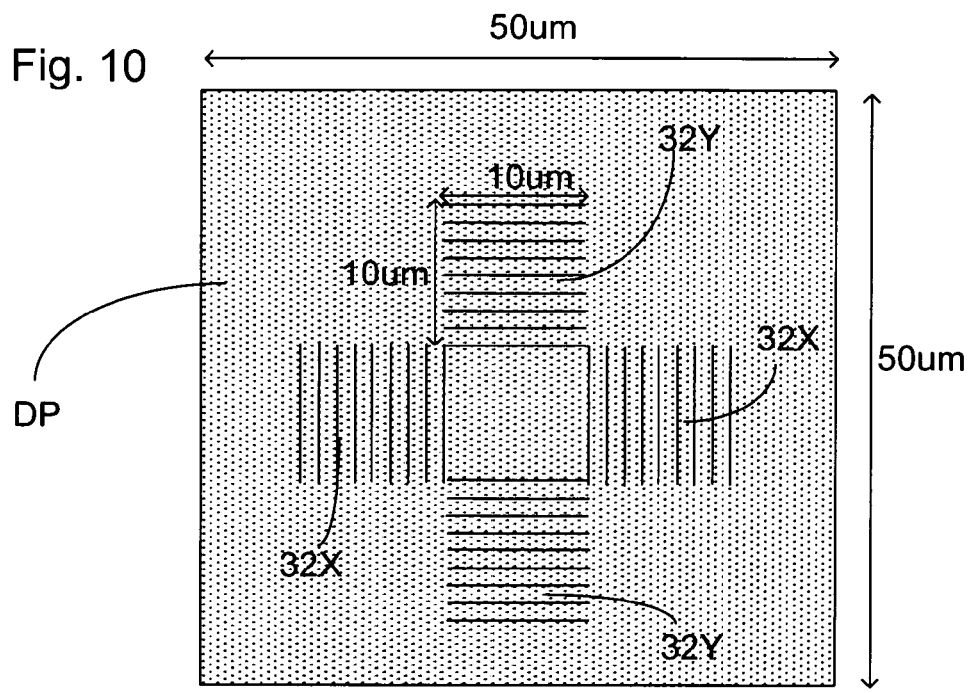
FIGS. 10, 11 and 12 depict various target orientations surrounded by dummy patterns.
Figure 11:
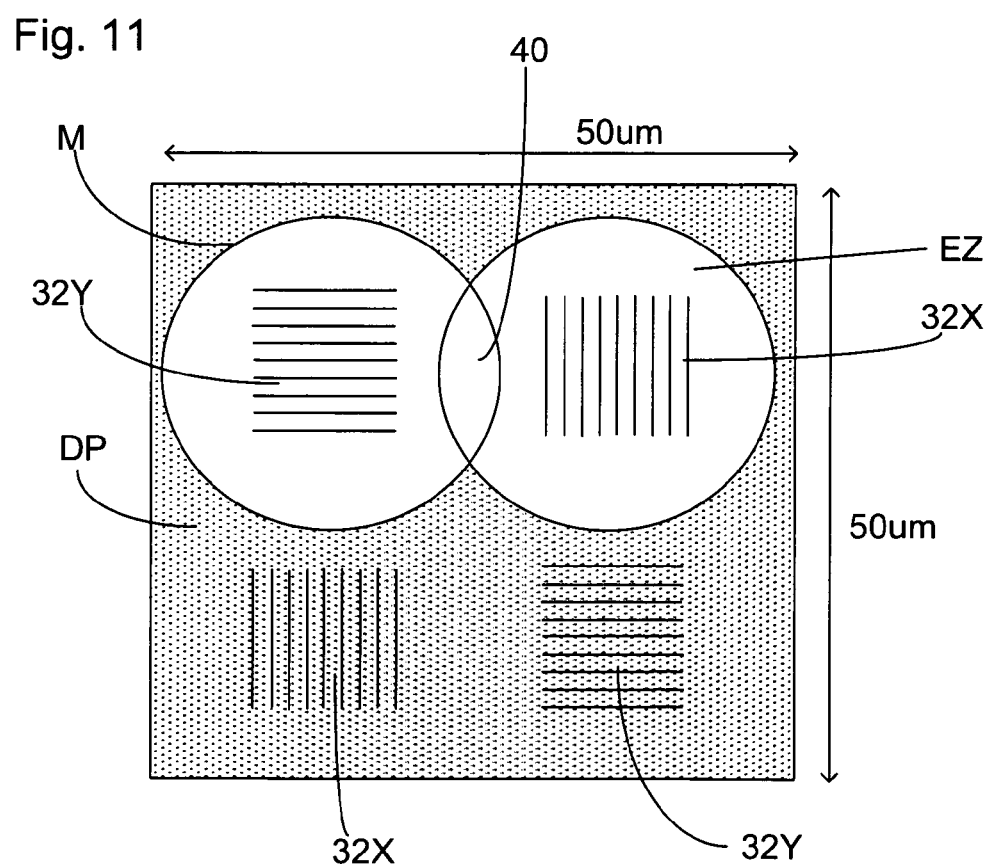

FIG. 10 shows an example of a scatterometry-based overlay target. The individual targets, 32X and 32Y, are each of the order of 10×10 μm. The entire area which will make up the "site target" may be of the order of 50×50 μm. The targets comprise gratings that are aligned both in the X and Y directions in order to obtain diffraction measurements in respect of both directions, useful for determining overlay errors. The key to being able to reduce the size of the targets to such a small area is that a measurement spot M may be bigger than each of the targets 32X and 32Y. The reason for this is that the targets are surrounded by a dummy pattern DP, which is an area of the surface surrounding the targets that creates a known diffraction pattern that can subsequently be removed from a received diffraction spectrum in order to obtain data from only the targets. The same concept is shown in FIG. 11, but the sub-targets, 32X and 32Y, are in different positions. It should be noted that in the embodiment of FIG. 10, a measurement spot would overlap, if it was surrounding target 32Y, with neighboring target 32X. The diffraction information from 32X would therefore have to be removed from that of 32Y. However, the orientation as shown in FIG. 11 does not suffer from this and so only the dummy pattern DP would need to be removed from the diffraction information that was received from the measurement spot surrounding each target 32Y and 32X. However, an additional advantage of the embodiment shown in FIGS. 10 to 16 is that "exclusion zones", which are the areas that are surrounding the targets but are within the measurement spot M, may overlap between the targets (common signals are recognized and eliminated). Because of this, the overall target site size may be reduced. The embodiment in FIG. 11 shows an overlap 40 of exclusion zones EZ.

Specifically, when two targets 32 as described above are placed into neighboring parts of, for example, the scribe lane, the exclusion zones EZ common to these targets can also be made to overlap to further reduce effective substrate real estate usage. Furthermore, when two targets as described above are placed into different levels of a layer stack being assembled on a substrate, the exclusion zones EZ common to these targets can also be made to overlap to reduce further effective substrate real estate usage. Indeed, if exclusion zones overlap, the information of the overlapping section that gives rise to a diffraction pattern may also be verified in a second scanning and exposure step and efficiency of the removal of the information from the exclusion zone can be increased. A specific embodiment of overlapping exclusion zones is to allow targets 32 with different characteristics (for example different grating orientations, or different pictures, etc., such as shown in FIG. 11) to be placed within the exclusion zone of another target, to allow the even further reduction of substrate real estate usage. In the case of anisotropic targets such as gratings, the robustness of this concept can be further enhanced by retaining the symmetry in the main diffraction directions and/or directions orthogonal to these directions.

Figure 12:
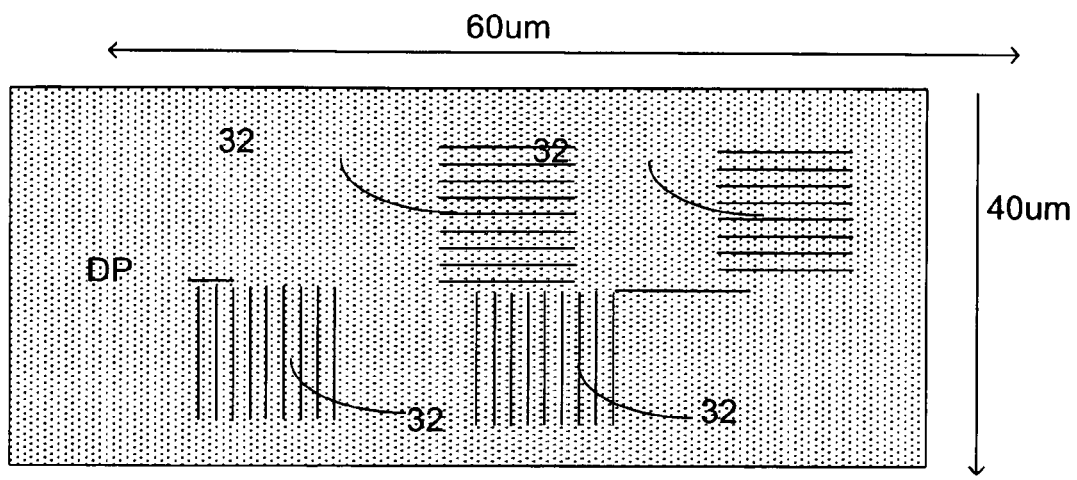

A slight modification of the embodiment of FIG. 11 is shown in FIG. 12, where the sub-targets 32 are arranged in such a way that the target may be reduced to 60×40 μm. Again, the exclusion zones around the targets 32 will include only either dummy pattern DP or other targets with either the same or orthogonal gratings.

As a further embodiment, the exclusion zones can be not only dummy patterns, but may also be any structure that will have a diffraction pattern that will be recognizable. Importantly, this could include product structures. To minimize the cross-talk between surrounding structures and the targets to be measured, the targets are optimized to minimize overlap between the measured signal originating from the target and from the surrounding area, e.g. by proper selection of critical dimension, pitch and/or orientation. In other words, the target format is chosen so that it is optimized in its differentiation from its surrounding area or its surrounding structures. This may, for instance, mean that the pitch of gratings is considerably smaller than the pitch of structures in a product such that a inspection radiation wavelength will be scattered by the target structures but not by the product structures. A further example of how this may occur is shown in FIG. 17. A measurement spot M is illustrated as encompassing two gratings A and B which are orthogonal to each other. The diffraction pattern 60 that would emerge from this measurement spot M is shown in the top of FIG. 17. The main zeroth diffraction order 50 is shown in the center of the diffraction pattern 60. This diffraction pattern 60 is detected in the pupil plane. In order to select the diffraction information of grating A only, only the asymmetry labeled X in the diffraction pattern 60 will be investigated and the asymmetry O will be ignored. On the other hand, to select the diffraction pattern of grating B only, the asymmetry O is investigated and the asymmetry X is ignored.

Figure 13:
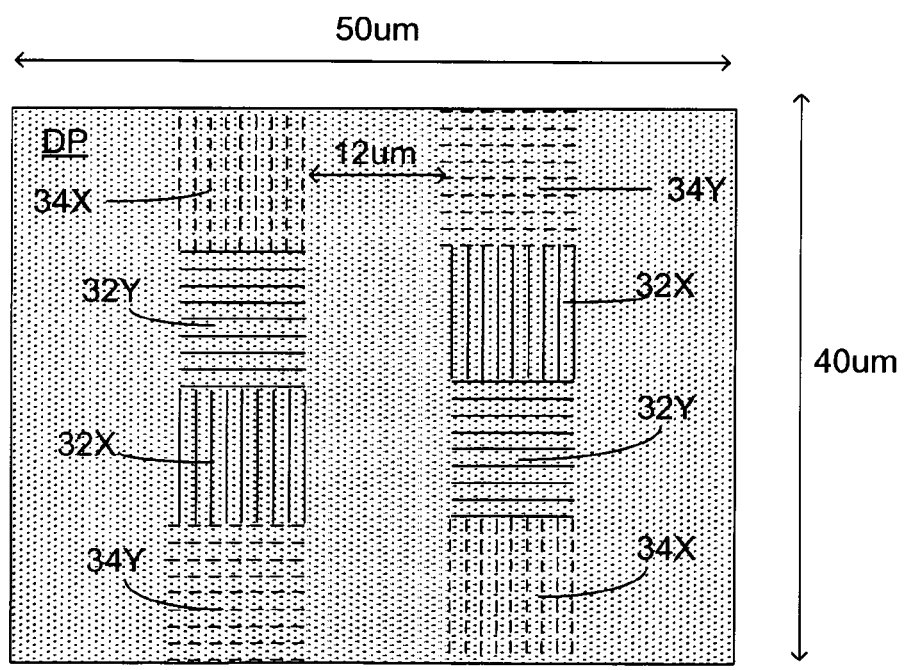

This principle is used in the targets that are shown in FIGS. 13 and 14. FIGS. 13 and 14 show target sites that contain dummy patterns DP as in FIGS. 10, 11 and 12 above. However, a further feature is incorporated into these target sites. This further feature is a dummy site 34. The use of dummy sites allows non-interfering target types to fall within each other's exclusion zones. Of course, if non-interfering target types may fall into each other's exclusion zones, there is no need for space between these types of target and the overall target site may be reduced. Several variations on this theme are possible. Two examples are shown in FIGS. 13 and 14.

The concept described above can be extended to two-dimensional targets such as that shown in FIG. 15. As a further embodiment of the present invention, FIG. 15 shows a two-dimensional target site with two targets, 36− and 36+ that are surrounded by a dummy pattern (which, of course, may include products or other structures as described above). The two-dimensional targets 36− and 36+ may also be 10×10 μm and may be used to measure overlay errors and/or critical dimension, etc. as known in the art. The top target 36− has for example a negative bias and the bottom target 36+ may therefore have a positive bias (i.e. one opposite to the top target 36−). The biases are known and enable errors in overlay to be determined (by comparing the actual overlay with the induced biases).

Figure 16:
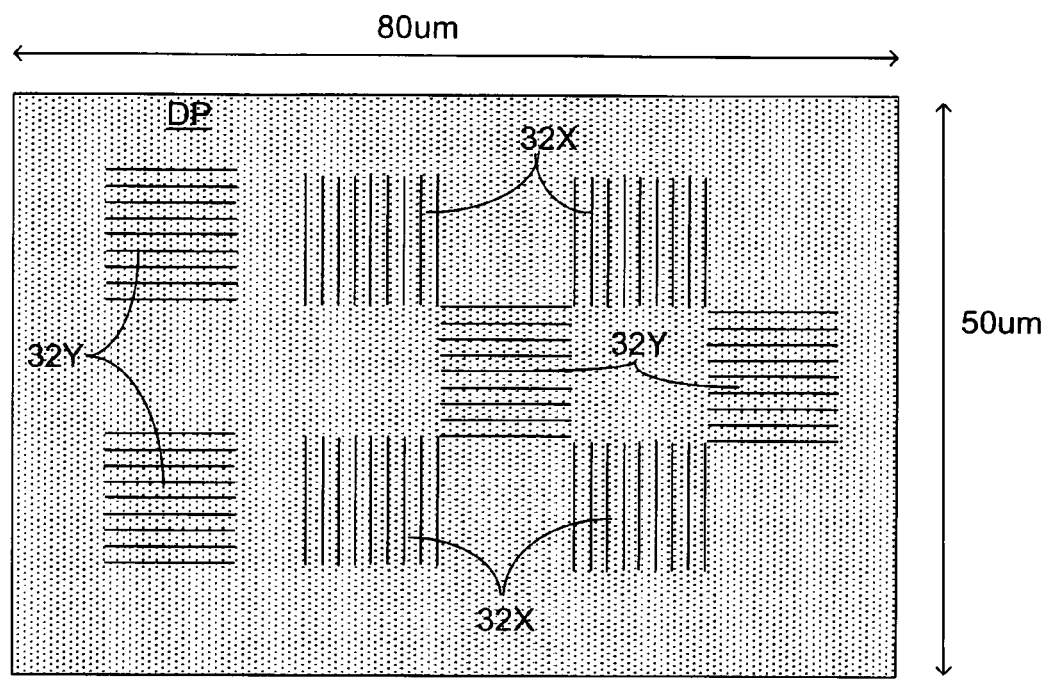
FIG. 16 depicts a target for use in three-dimensional stacking.

As a yet alternative embodiment, FIG. 16 shows a further possible layout of targets 32. Specifically, FIG. 16 shows a layout that may be used in target stacking in multiple layers. Semiconductor devices are built up of many layers and overlay (and other) measurements are required between all consecutive layers. Targets cannot generally be placed directly above each other because of cross-talk, causing even more substrate area to be taken up by targets. The aggregate area needed for overlay targets for all layers combined is a linear sum of the target areas per layer. Overlapping or skipping exclusion zones may decrease this linear sum. In layer-to-layer target stacking, a proper ordering of target grating orientations (namely having X and Y direction gratings neighboring each other) allows the overlapping or even removal of the exclusion zones between the targets for the respective layers, or respective layer combinations in the case of a layer-to-layer overlay measurement, thus further reducing the effective aggregate target size over the combined layers. For example, with a target size including exclusion zones of 50×50 μm, stacking targets in this manner allows additional layers to add only 30×50 μm.

The advantages of the exclusion zones and the smaller targets as described above are that the scribe lane may have less of its area used. Targets are also protected from the impact of processing on a product and may be reused. The embodiments described above are also extendable to in-die target application where the dummy pattern may be simply the product structures, thus saving even more space in the scribe lanes.

Algorithms may be used to derive the desired information from the measurement of the targets (such as overlay or CD parameters) that are modified to minimize effectively the cross talk between the signal originating from the target and the spurious signals originating from its surroundings (including spurious signals from other gratings within or close to the measurement spot). Furthermore, it is possible to make the measurement spot adjustable to fit the target in an optimal way. On one hand, the SNR can be maximized while the target/spot placement sensitivities may be minimized. Furthermore, contributions from neighboring targets may be minimized by minimizing the illumination area outside of the target itself.

The present invention may also be used in combination with Fourier filtering concepts. This embodiment works by filtering out the diffraction from the surrounding pattern (in the pupil plane) such that only the portions from the target remain.

Figure 18:
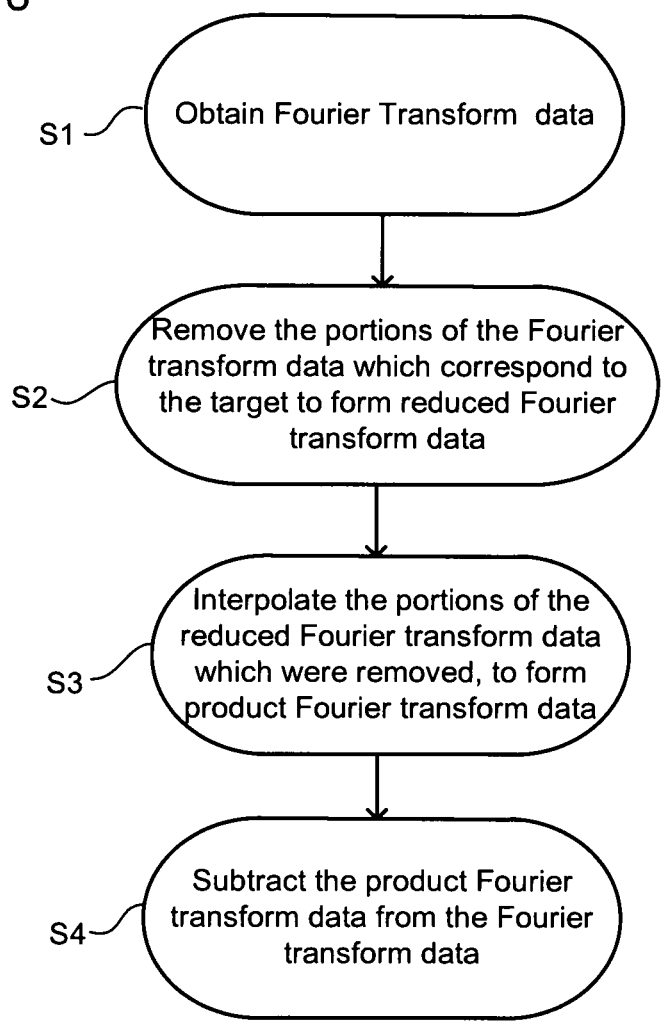
FIGS. 18 and 19 depict alternative examples of mathematical removal of information from the area surrounding the substrate.

The invention operates in the pupil plane and comprises the following steps, as shown in FIG. 18:

a) obtaining Fourier transform data, S1;
b) removing portions of the Fourier transform corresponding to the target, S2;
c) interpolating the remaining Fourier transform over the removed portions, S3; and
d) subtracting the Fourier transform of step (c) from the Fourier transform of step (a), S4.

Step (a) may be achieved by placing the detector in the pupil plane (or alternatively by detecting data and performing a Fourier transform). Then based on the aperture, pitch and orientation of the target the portions of the Fourier transform data corresponding to the target can be removed. The targets generally have a pitch of 500-1000 nm, whereas the surrounding pattern has a much smaller pitch. Thus if radiation of a suitable wavelength is used and combined with a suitable numerical aperture there will first order contributions only from the target. There will additionally be some lower intensity scattering from the surrounding patterns, which step (c) aims to estimate. Any knowledge of the surrounding pattern can be used to improve the interpolation of step (c). Step (c) estimates the cross-talk from the surrounding pattern. By subtracting the Fourier transform of the surrounding pattern (including estimated cross-talk) from the original Fourier transform data, the Fourier transform of the target remains. The target data remaining can then be used to calculate the overlay error, or for any other purposes.

Figure 19:
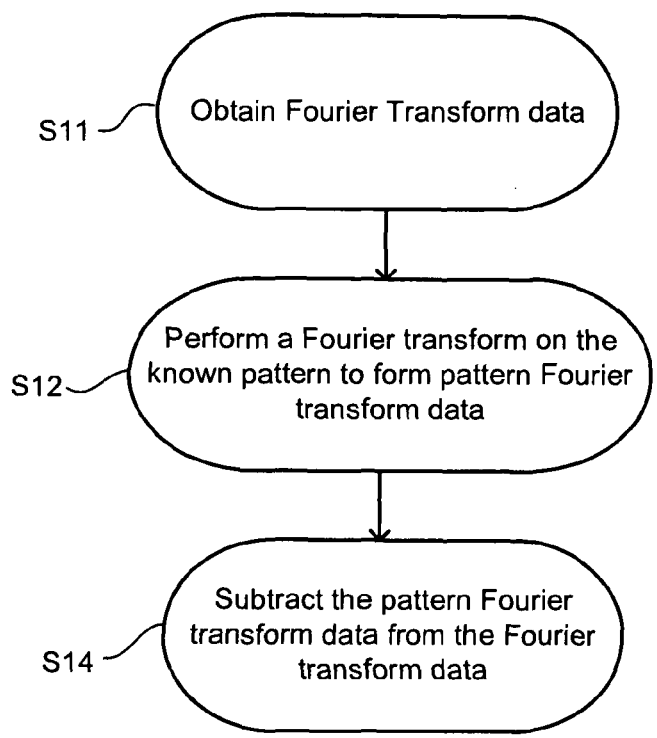

In another embodiment of the invention, the Fourier transform of the pattern (excluding the target) on the substrate is known. The invention thus comprises the following steps, as shown in FIG. 19:

(a) obtaining Fourier transform data, S11;
(b) performing a Fourier transform on the known pattern, S12; and
(c) subtracting the Fourier transform of step (b) from the Fourier transform of step (a), S14.

This method avoids the need for approximating the cross-talk from the pattern and the lower intensity scattering by using the Fourier transform of the known pattern. Thus, in this embodiment, a larger angular spread may be used and a target with a larger overlay range may be detected. However, this method relies on the structure of the surrounding pattern being known.

Figure 20A:
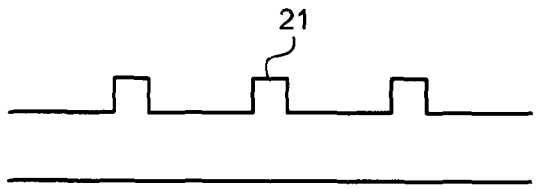
FIGS. 20 a-d depicts some of the steps involved in an embodiment of the invention related to FIGS. 18 and 19.
Figure 20B:
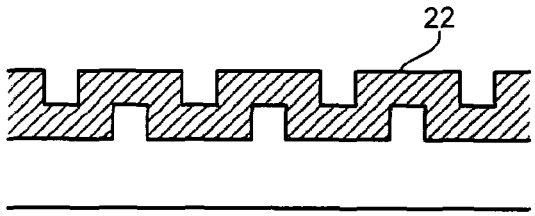
Figure 20C:
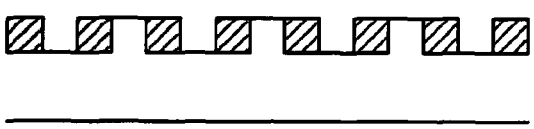
Figure 20D:
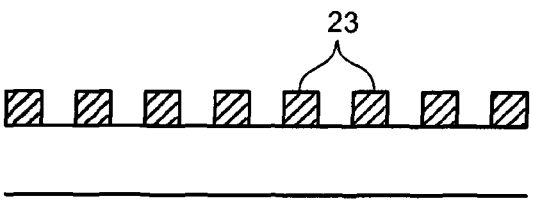

According to a further embodiment of the invention, the method is used to determine the symmetry of conformal coatings. According to this embodiment, a sacrificial feature 21 is generated, as shown in FIG. 20a and, as shown in FIG. 20b, a coating 22 is applied. The conformal coating is etched back to reveal the top of the feature (FIG. 20c). The feature is then removed, usually by etching to leave just the conformal layer feature, 23 (FIG. 20d) at a lower pitch than the original feature. Radiation is then projected onto the substrate and the reflected radiation detected. The method then comprises the following steps:

a) obtaining Fourier transform data;
b) removing portions of the Fourier transform corresponding to the conformal layer feature;
c) interpolating the remaining Fourier transform over the removed portions; and
d) subtracting the Fourier transform of step (c) from the Fourier transform of step (a).

The resulting data can then be used to determine characteristics of the coating and the substrate itself.

Alternatively, if the surrounding pattern is known, the method may comprise steps in accordance with the second embodiment of the invention, namely:

(a) obtaining Fourier transform data;
(b) performing a Fourier transform on the known pattern; and
(c) subtracting the Fourier transform of step (b) from the Fourier transform of step (a).

This embodiment has been described primarily in conjunction with an angle resolved scatterometer, although it may also be used in conjunction with, for example, a spectroscopic scatterometer or an ellipsometer.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection apparatus. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An inspection apparatus comprising:
an optical system configured to focus a radiation beam into a measurement spot onto a substrate, the measurement spot comprising:
a target area comprising a periodic structure on the substrate, and
an area surrounding the target area:
a detector, positioned in a pupil plane of a high numerical aperture lens of the optical system, configured to detect a signal, wherein:
a first portion of the signal corresponds to a first portion of the radiation beam reflected from the target area, and
a second portion of the signal corresponds to a second portion of the radiation beam reflected only from the area surrounding the target area, the second portion of the signal being different from the first portion of the signal; and
a processor configured to:
derive a property of the substrate using the first portion of the signal; and
eliminate the second portion of the signal.

2. The inspection apparatus according to claim 1, wherein;
the first portion of the signal corresponds to a first diffraction pattern; and
the second portion of the signal corresponds to a second diffraction pattern when the area surrounding the target area comprises a plurality of patterned areas.

3. The inspection apparatus according to claim 1, wherein the target area is smaller than 15 by 15 microns.

4. The inspection apparatus according to claim 1, wherein the processor is configured to derive a dimension of the periodic structure within the target area based on the first portion of the signal.

5. The inspection apparatus according to claim 1, wherein the target area is within a product die on the substrate.

6. The inspection apparatus according to claim 1, wherein the measurement spot is larger than the target area in at least one dimension.

7. A method of measuring a parameter of a lithographic process, the method comprising:
focusing, using an optical system, a radiation beam into a measurement spot on a substrate, the measurement spot comprising:
a target area comprising a periodic structure on the substrate, and
an area surrounding the target area;
detecting, using a detector positioned in a pupil plane of a high numerical aperture lens of the optical system, a signal wherein:

a first portion of the signal corresponds to a first portion of the radiation beam reflected from the target area, and a second portion of the signal corresponds to a second portion of the radiation beam reflected only from the area surrounding the target area, the second portion of the signal being different from the first portion of the signal;

deriving, using a processor, a property of the substrate based on the first portion of the signal; and eliminating, using the processor, the second portion of the signal.

8. The method according to claim 7, wherein:
the first portion of the signal corresponds to a first diffraction pattern; and
the second portion of the signal corresponds to a second diffraction pattern when the area surrounding the target area comprises a plurality of patterned areas.

9. The method according to claim 7, comprising:
deriving, using the processor, a dimension of the periodic structure within the target area based on the first portion of the signal.

10. The method according to claim 7, comprising:
deriving, using the processor, a thickness of a layer on the substrate based on the first portion of the signal.

11. The method according to claim 7, comprising:
deriving, using the processor, a profile of a structure within the target area or a dimension of the structure within the target area based on the first portion of the signal.

12. The method according to claim 7, further comprising determining an error in overlay of a first grating superimposed on a second grating within the target area.

13. The method according to claim 7, further comprising selecting a portion of the radiation beam using an aperture at an intermediate image plane of the optical system in order to reduce a dimension of the measurement spot.

14. The method according to claim 7, further comprising mathematically differentiating a first diffraction spectrum from a second diffraction spectrum, wherein:
the first diffraction spectrum corresponds to the first portion of the signal; and
the second diffraction spectrum corresponds to the second portion of the signal, the second diffraction spectrum being different from the first diffraction spectrum.

15. The method according to claim 7, further comprising selecting a wavelength of the radiation, wherein the wavelength is scattered by the target area and is unscattered by the area surrounding the target area.

16. The method according to claim 7, further comprising using an area smaller than 15 by 15 microns as the target area.

17. The method according to claim 7, further comprising using an area within a product die on the substrate as the target area.

18. A lithographic apparatus comprising:
an illumination system configured to illuminate a pattern comprising a sub-pattern of a periodic structure;
a projection system configured to project an image of the pattern on to a substrate; and
an inspection apparatus configured to derive a property of the substrate by measuring a target area on the substrate, the inspection apparatus comprising:
an optical system configured to focus a radiation beam into a measurement spot onto the substrate, the measurement spot comprising:
the target area comprising the periodic structure on the substrate, and
an area surrounding the target area;
a detector, positioned in a pupil plane of a high numerical aperture lens of the optical system, configured to detect a signal, wherein:
a first portion of the signal corresponds to a first portion of the radiation beam reflected from the target area, and
a second portion of the signal corresponds to a second portion of the radiation beam reflected only from the area surrounding the target area, the second portion of the signal being different from the first portion of the signal; and
a processor configured to:
derive a property of the substrate using the first portion of the signal; and
eliminate the second portion of the signal.

19. A lithographic cell comprising:
a coater configured to coat a substrate with a radiation sensitive layer;
a lithographic apparatus configured to expose images onto the radiation sensitive layer;
a developer configured to develop images exposed by the lithographic apparatus; and
an inspection apparatus configured to derive a property of the substrate by measuring a target area on the substrate, the inspection apparatus comprising:
an optical system configured to focus a radiation beam into a measurement spot onto the substrate, the measurement spot comprising:
the target area comprising a periodic structure on the substrate, and
an area surrounding the target area;
a detector, positioned in a pupil plane of a high numerical aperture lens of the optical s stem configured to detect a signal, wherein:
a first portion of the signal corresponds to a first portion of the radiation beam reflected from the target area, and
a second portion of the signal corresponds to a second portion of the radiation beam reflected only from the area surrounding the target area, the second portion of the signal being different from the first portion of the signal; and
a processor configured to:
derive a property of the substrate using the first portion of the signal; and
eliminate the second portion of the signal.

20. A device manufacturing method comprising:
using a lithographic apparatus to form a pattern on a substrate, the pattern comprising a sub-pattern of a periodic structure; and
determining a value related to a parameter of the pattern, the determining comprising:
focusing a radiation beam into a measurement spot onto the substrate using an optical system, the measurement spot comprising:
the pattern on the substrate, and
an area surrounding the pattern; and
detecting, using a detector positioned in a pupil plane of a high numerical aperture lens of the optical system, a signal wherein:
a first portion of the signal corresponds to a first portion of the radiation beam reflected from the target area, and a second portion of the signal corresponds to a second portion of the radiation beam reflected only from the area surrounding the target area, the second portion of the signal being different from the first portion of the signal;

deriving, using a processor, a property of the substrate based on the first portion of the signal; and eliminating, using the processor, the second portion of the signal.

21. The inspection apparatus according to claim 1, wherein:

the target area comprises target features oriented along a first direction; and at least portions of the area surrounding the target area that are adjacent to the target area comprise pattern features oriented along a second direction, the second direction being different from the first direction.

22. The inspection apparatus according to claim 21, wherein the first direction is perpendicular to the second direction.

23. The inspection apparatus according to claim 1, wherein the area surrounding the target area comprises an unpatterned area.

24. The inspection apparatus according to claim 1, wherein:

the target area comprises a first pattern; and the area surrounding the target area comprises patterned areas, wherein at least one of the patterned areas adjacent to the target area comprises a second pattern, the second pattern being different from the first pattern.

25. The inspection apparatus according to claim 24, wherein the patterned areas comprise metrology target areas or device pattern areas.

26. The inspection apparatus according to claim 24, wherein the second portion of the signal comprises a plurality of signals, each signal of the plurality of signals corresponding to a sub-portion of the second portion of the radiation beam reflected from a corresponding one of the patterned areas.

27. The method according to claim 7, further comprising:

using target features oriented along a first direction in the target area; and using pattern features oriented along a second direction in at least portions of the area surrounding the target area that are adjacent to the target area, the second direction being different from the first direction.

28. The method according to claim 27, wherein the first direction is perpendicular to the second direction.

29. The method according to claim 7, further comprising using an unpatterned area as the area surrounding the target area.

30. The method according to claim 7, further comprising:

using a first pattern in the target area; and using patterned areas in the area surrounding the target area, wherein at least one of the patterned areas adjacent to the target area comprises a second pattern, the second pattern being different from the first pattern.

31. The method according to claim 30, further comprising using metrology target areas or device pattern areas as the patterned areas.

32. The method according to claim 30, wherein the second portion of the signal comprises a plurality of signals, each of the plurality of signals corresponding to a sub-portion of the second portion of the radiation beam reflected from a corresponding one of the patterned areas.

* * * * *